United States Patent
Chang

[11] Patent Number: 6,157,590
[45] Date of Patent: Dec. 5, 2000

[54] SOLID STATE MEMORY HAVING A LATCH CIRCUIT

[75] Inventor: Sang Hoan Chang, Kyungki-do, Rep. of Korea

[73] Assignee: Hyundai Electronics Industries Co., Ltd., Kyungki-do, Rep. of Korea

[21] Appl. No.: 09/404,143

[22] Filed: Sep. 27, 1999

[30] Foreign Application Priority Data

Sep. 28, 1998 [KR] Rep. of Korea ............. 98-40398

[51] Int. Cl.[7] .............................................. G11C 8/00
[52] U.S. Cl. ................. 365/230.08; 365/185.05; 365/185.07
[58] Field of Search .............. 365/230.08, 189.05, 365/189.07

[56] References Cited

U.S. PATENT DOCUMENTS

| | | | |
|---|---|---|---|
| 5,163,021 | 11/1992 | Mehrotra et al. | 365/185 |
| 5,247,657 | 9/1993 | Myers | 395/550 |
| 5,388,083 | 2/1995 | Assar et al. | 365/218 |
| 5,430,859 | 7/1995 | Norman et al. | 395/425 |
| 5,568,424 | 10/1996 | Cernea et al. | 365/185.33 |
| 5,592,420 | 1/1997 | Cernea et al. | 365/185.18 |
| 5,621,685 | 4/1997 | Cernea et al. | 365/185.18 |
| 5,809,337 | 9/1998 | Hannah et al. | 395/853 |
| 5,838,614 | 11/1998 | Estakhri et al. | 365/185.11 |

FOREIGN PATENT DOCUMENTS

| | | |
|---|---|---|
| 6-052674 | 2/1994 | Japan . |
| 8-095727 | 4/1996 | Japan . |
| 10-097459 | 4/1998 | Japan . |
| 10-187454 | 7/1998 | Japan . |
| 10-257278 | 9/1998 | Japan . |

*Primary Examiner*—Son T. Dinh
*Assistant Examiner*—Tuan T. Nguyen
*Attorney, Agent, or Firm*—Pennie & Edmonds LLP

[57] ABSTRACT

A solid state memory according to the present invention comprises a plurality of memory chips; a confirmation circuit to confirm an input address by comparing said input address to each address latched to a latch circuit; a common serial bus for transmitting commands, addresses and data between the memory chips and the confirmation circuit; and a printed circuit board on which the memory chips and the confirmation circuit are mounted.

3 Claims, 2 Drawing Sheets

SOLID STATE MEMORY HAVING A LATCH CIRCUIT

BACKGROUND OF THE INVENTION

1. Field of the Invention

The present invention relates generally to a semiconductor memory device, and more particularly to a solid state memory having a latch circuit in which a chip address on a printed circuit board (PCB) or a system is stored on a flash memory cell in a solid state memory device having a plurality of memory chips and serial buses in order to reduce the number of chip pads, thereby lowering the cost and the number of pins to reduce poor throughput and also to simplify the circuit on the substrate.

2. Description of the Prior Art

Generally, as higher degree of integration is required for a memory device, a product has been developed in which a plurality of memory chips are included into a single memory device. In this case, it is more cost effective to construct the bus structure of this memory device as a few serial bus structure rather than a plurality of parallel bus structure so that it makes the printed circuit board thereof more simplified.

However, since commands, and addresses and data are commonly transmitted to the plurality of chips, it is extremely important to confirm respective chips and addresses.

FIG. 1 shows a memory module of a conventional solid state memory, in which a plurality of memory chips 2, and address pads 4 using the address received from outside as an input to select the memory chips are mounted on a printed circuit board 1. In FIG. 1, address pins 3 are connected between the memory chips 4 and the address pads 4. Also, the memory chips 2 are connected to a common serial bus 5. The address pins 3 of the memory chips 2 are fixed to the address pads 4 on the printed circuit board 1 to recognize the address of each of the memory chips 2. Address such as the power supply Vcc and the ground Vss, which are supplied to the address pads 3, may expressed into "1" and "0", respectively, for convenience of explanation.

FIG. 2 shows a conventional confirmation circuit diagram of confirming commands and data inputted to a common serial bus when eight (8) memory chips are mounted on the memory module. The circuit serves to confirm commands and data inputted via the common serial bus 5 commonly connected to each of the memory devices, in case that eight (8) memory chips 2 are mounted on the memory module on the printed circuit board 1. In this case, each of the memory chips 2 requires three (3) address pins 3, and the address of the memory chip 2 represented in the address latch means 10 of FIG. 2 is "110", which represents the sixth memory chip in the memory chip. At this time, if the address of the memory chip 2 is inputted to the serial input terminal 6 via the serial bus 5 along with the clock signal CK and the chip select signal CS. The input address is supplied to the comparator 9 via the three signal lines 8 through the shift register 7.

Also, the address of the memory device, which is inputted from the address latch means 10 via the address pads 4 on the printed circuit board 1, is supplied to the comparator 9. The comparator 9 confirms whether the two addresses are identical or not. If so, it drives a corresponding memory chip.

However, this conventional technology requires that three address pads and three address pins be mounted on a single printed circuit board if eight memory devices are mounted on it. Thus, it has disadvantages in that the circuit on the printed circuit board on which the memory devices are mounted, becomes complicated and the productivity is lowered due to defects of the address pins during the process of package or when the memory chips are mounted on the printed circuit board.

SUMMARY OF THE INVENTION

It is therefore an object of the present invention to provide a semiconductor memory device, in which addresses are latched to flash EEPROM cells within respective semiconductor chips to reduce the area of the address pad and the number of pins on the printed circuit board.

In order to accomplish the above object, a solid state memory according to the present invention comprises a plurality of memory chips; a confirmation circuit to confirm an input address by comparing said input address to each address latched to a latch circuit; acommonserial bus for transmitting commands, addresses and data between the memory chips and the confirmation circuit; and a printed circuit board on which the memory chips and the confirmation circuit are mounted

BRIEF DESCRIPTION OF THE DRAWINGS

The aforementioned aspects and other features of the present invention will be explained in the following description, taken in conjunction with the accompanying drawing, wherein.

DETAILED DESCRIPTION OF PREFERRED EMBODIMENTS

Figure 1:
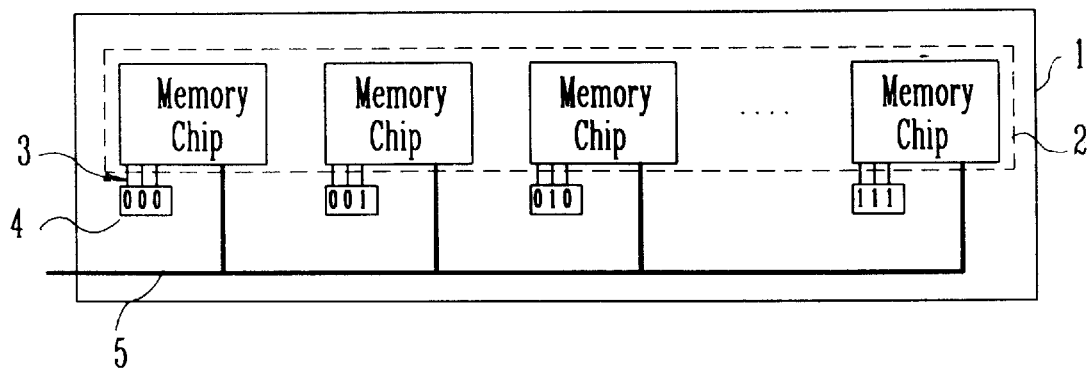
FIG. 1 shows a memory module of a conventional solid state memory.
Figure 2:
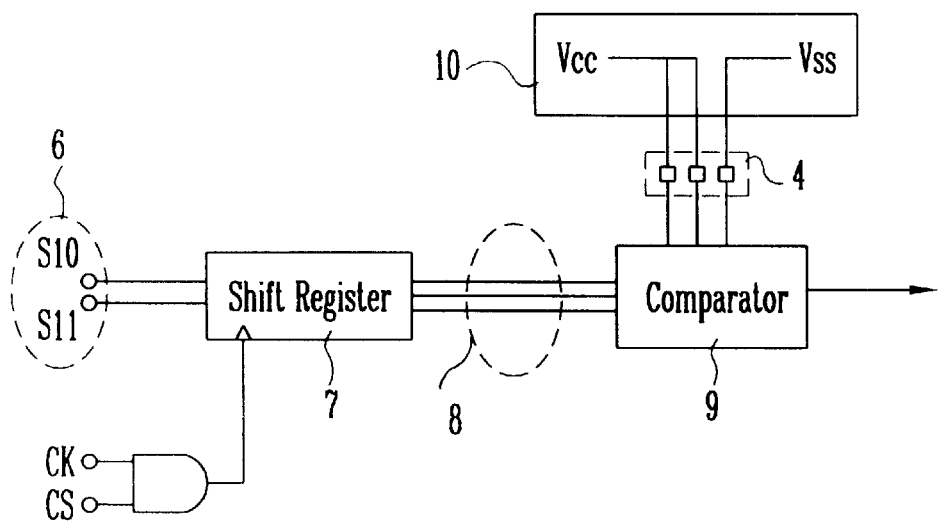
FIG. 2 shows a conventional confirmation circuit diagram.

The present invention will be described in detail by way of a preferred embodiment with reference to accompanying drawings, in which like reference numerals are used to identify the same or similar parts.

Figure 3:
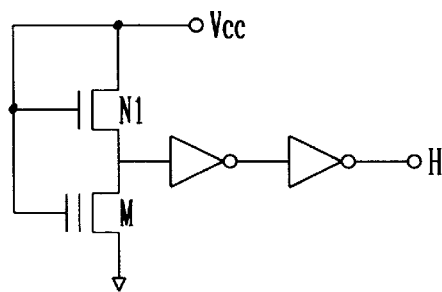
FIG. 3 shows an address latch circuit applicable to the present invention.

FIG. 3 shows an address latch circuit applicable to the present invention. The circuit in FIG. 3 shows one simple example of a flash EEPROM cell M, located within the semiconductor device, for storing the address on the printed circuit board in a semiconductor device and for sensing it. The transistor N1 on the side of the power supply Vcc uses a NMOS transistor, the current transmission ability of which is low as possible.

For example, when electrons are injected to the gate of the flash EEPROM cell M, the current pass on the side of the ground Vss becomes blocked. Thus, the supply power having a high state HIGH is supplied to the output terminal H from the supply power Vcc via the NMOS transistor N1.

On the contrary, when holes are injected to the floating gate of the flash EEPROM cell M, the current flowing through the flash EEPROM cell M is large compared to that flowing through the NMOS transistor N1. Thus, the ground voltage having a low state LOW is supplied to the output terminal H from the ground Vss via the flash EEPROM cell M.

That is, the address on the printed circuit board is stored depending on the program state of the flash EEPROM cell M.

Figure 4:
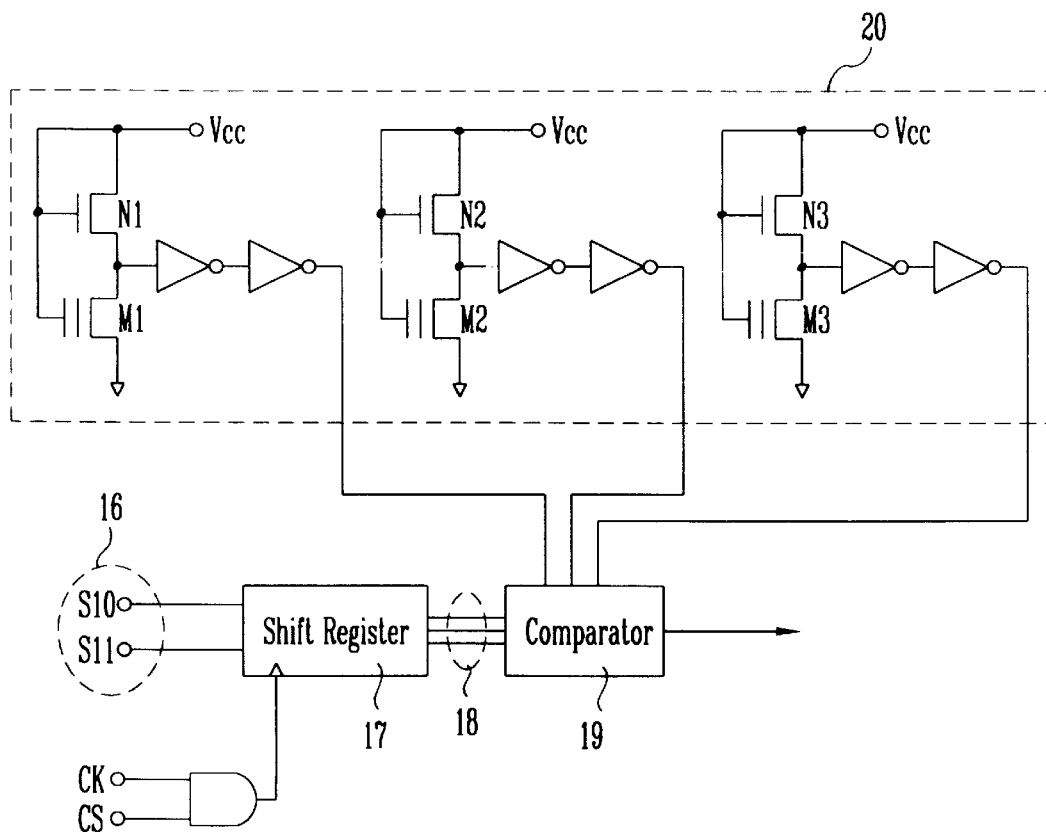
FIG. 4 shows a confirmation circuit diagram according to the present invention.

FIG. 4 shows a confirmation circuit diagram according to the present invention. The circuit in FIG. 4 may use an address latch circuit using the flash EEPROM cell shown in FIG. 3 in order to latch the address on the printed circuit board.

For example, if the memory module on the printed circuit board 1 has eight (8) memory devices, when the address of the memory device within the printed circuit board is "100", it represents fourth memory device in the memory module. At this time, when the address of the memory chip 2 is transmitted to the serial input terminal 16 via the serial port 5 along with the clock signal CK and the chip select signal CS, the inputted address is supplied to the comparator 19 via three signal lines 18 through the shift register 17. Also, each of the addresses, which is latched to respective flash memory cells M1 through M3 in the address latch means 20 on the printed circuit board 1, is supplied to the comparator 19. The comparator 19 compares the address inputted through the shift register 17 with the address inputted through the address latch means 20 and then drives a corresponding memory chip depending on the comparison result.

In other words, in case the 8M flash memory cell currently manufactured by the 0.35 $\mu$m technology, the size of the pads is about 200 $\mu$m×200 $\mu$m. For example, when 8 memory chips are mounted on a single printed circuit board, the number of necessary address is three. However, the size of the memory chip which can be reduced by the present invention is 120000 $\mu$m and, when converting into a single cell size, it is 60 Kb occupying about 0.75% of the entire cell size.

As mentioned above, according to the present invention, it latches the address to the flash EEPROM cell within the semiconductor device, thus reducing the size of the address pad and the number of pin of the package on the printed circuit board, both of which are connected to the external. Therefore, it can reduce the size of the pad when manufacturing the memory chip, thus reducing the manufacturing cost and also simplifying the circuit on the printed circuit board on which the memory chips are mounted. Also, it can reduce the pin number of the package, thus preventing reduction in productivity due to defects of address pins during the process of package or when the memory chips are mounted on the printed circuit board.

The present invention has been described with reference to a particular embodiment in connection with a particular application. Those having ordinary skill in the art and access to the teachings of the present invention will recognize additional modifications and applications within the scope thereof It is therefore intended by the appended claims to cover any and all such applications, modifications, and embodiments within the scope of the present invention.

What is claimed are:

1. A solid state memory, comprising:
    a plurality of memory chips;
    a confirmation circuit to confirm an input address by comparing said input address to each address latched to a latch circuit;
    a common serial bus for transmitting commands, addresses and data between said memory chips and said confirmation circuit; and
    a printed circuit board on which said memory chips and said confirmation circuit are mounted.

2. The solid state memory of the claim 1, wherein said confirmation circuit comprising;
    said latch circuit for latching each address of said chips;
    a shift register to output said input address according to a control signal; and
    a comparator to compare said addresses latched to said latch circuit with said input address.

3. The solid state memory of the claim 1, wherein said latch circuit comprises a flash EEPROM cell.

* * * * *